United States Patent [19]
Lake et al.

[11] Patent Number: 6,166,915
[45] Date of Patent: *Dec. 26, 2000

[54] ELECTRONIC CIRCUITS AND CIRCUIT BOARDS

[75] Inventors: Rickie C. Lake, Eagle; Joe Mousseau; Mark E. Tuttle, both of Boise, all of Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/790,916

[22] Filed: Jan. 29, 1997

Related U.S. Application Data

[62] Division of application No. 08/585,428, Jan. 11, 1996.

[51] Int. Cl.$^7$ ..................................... H05K 1/03
[52] U.S. Cl. .................... 361/748; 361/750; 361/760; 361/793; 174/256; 174/258; 174/260; 29/830; 29/846; 427/96; 428/901
[58] Field of Search ................... 174/52.1–52.4, 174/250, 254, 255–258, 260, 261; 257/678, 723, 787–790, 79, 81, 99, 100, 433–437; 264/272.14, 272.17; 361/737, 749, 760, 750, 748, 751, 820, 792–795; 439/68; 29/829, 830, 846; 427/510, 511, 96, 504; 438/FOR 369, 106, 107, 110, 114, 116; 428/901, 195, 209–220; 250/239

[56] References Cited

U.S. PATENT DOCUMENTS

| | | | |
|---|---|---|---|
| 4,075,632 | 2/1978 | Baldwin et al. | 342/51 |
| 4,722,765 | 2/1988 | Ambros et al. | 216/16 |
| 4,788,163 | 11/1988 | Hang et al. | 428/901 |
| 4,808,673 | 2/1989 | Hang et al. | 428/901 |
| 4,830,988 | 5/1989 | Hang et al. | 428/901 |
| 4,863,517 | 9/1989 | Hang et al. | 428/901 |
| 4,874,550 | 10/1989 | Hang et al. | 428/901 |
| 4,926,182 | 5/1990 | Ohta et al. | 342/44 |
| 5,042,971 | 8/1991 | Ambrose | 361/749 |
| 5,194,698 | 3/1993 | Souto et al. | 174/250 |
| 5,197,184 | 3/1993 | Crumly et al. | 29/846 |
| 5,218,759 | 6/1993 | Juskey et al. | 264/272.17 |
| 5,426,850 | 6/1995 | Fukutomi et al. | 29/848 |
| 5,463,229 | 10/1995 | Takase et al. | 257/59 |
| 5,621,412 | 4/1997 | Sharpe et al. | 342/51 |
| 5,649,296 | 7/1997 | MacLellan et al. | 455/38.2 |
| 5,677,568 | 10/1997 | Ochi et al. | 257/679 |

FOREIGN PATENT DOCUMENTS

| | | | |
|---|---|---|---|
| 0244259 | 11/1987 | European Pat. Off. | 361/748 |

Primary Examiner—Jeffrey Gaffin
Assistant Examiner—John B. Vigushin
Attorney, Agent, or Firm—Wells, St. John, Roberts, Gregory & Matkin, P.S.

[57] ABSTRACT

A method of forming a circuit board includes, a) providing a temporary substrate; b) depositing an uncured electrically insulative circuit board material over the temporary substrate, the circuit board material adhering to the temporary substrate; c) substantially curing the uncured circuit board material into at least one self supporting sheet; d) providing circuit traces atop the cured self supporting sheet; e) mounting an electronic circuit component atop the cured self supporting sheet in electrical communication with the circuit traces; and f) peeling the temporary substrate and cured self supporting sheet from one another. An electronic circuit of the invention includes, i) a self-supporting electrically insulative ink or paint substrate, the ink or paint substrate having an outer surface; ii) circuit traces provided on the ink or paint substrate outer surface; and iii) at least one electronic circuit component mounted to the ink or paint substrate outer surface in electrical connection with the circuit traces.

12 Claims, 5 Drawing Sheets

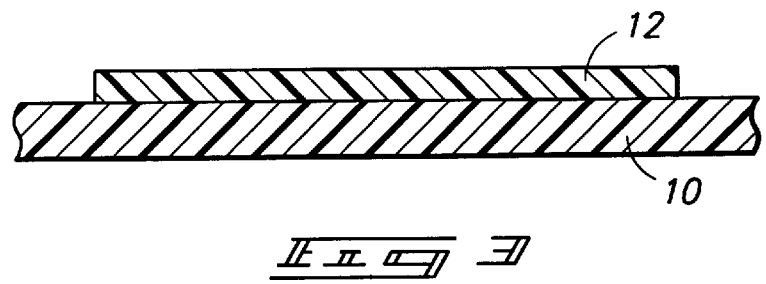
_Fig. 3_
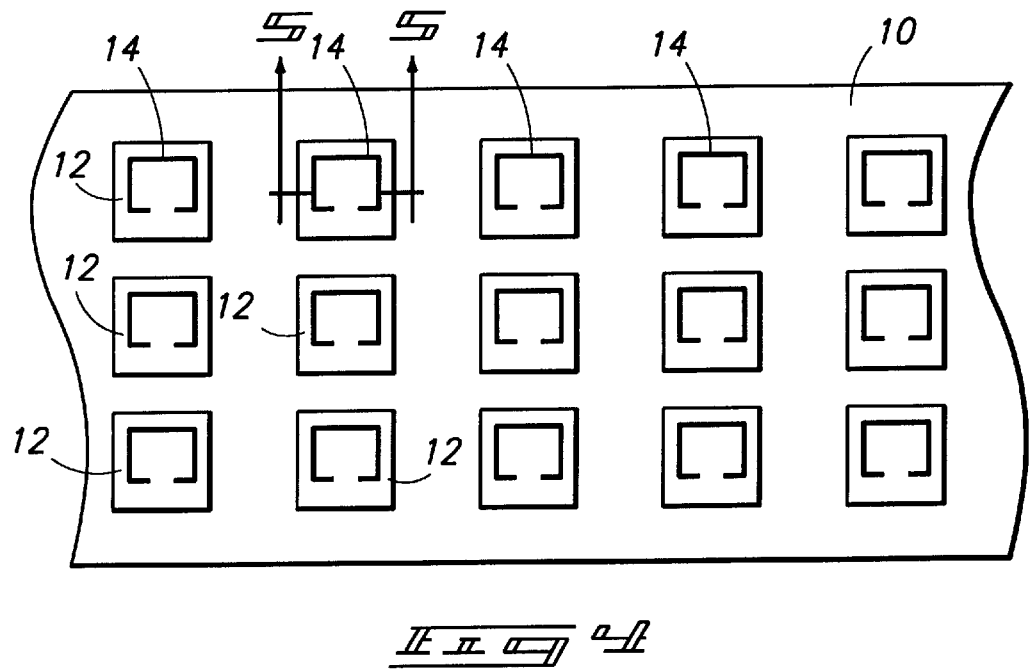
_Fig. 4_
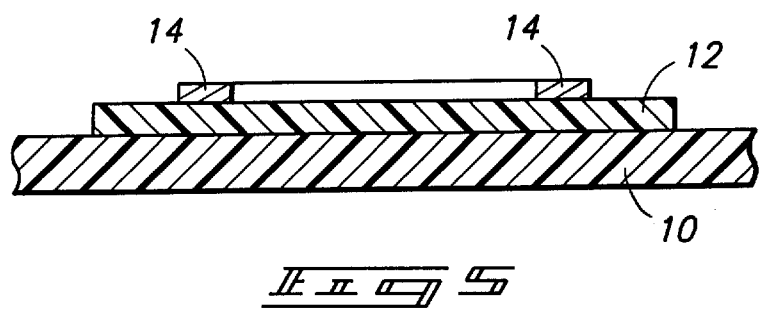
_Fig. 5_

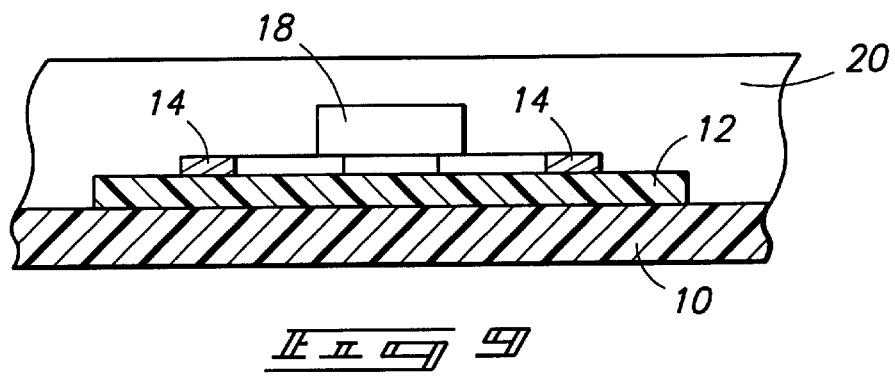
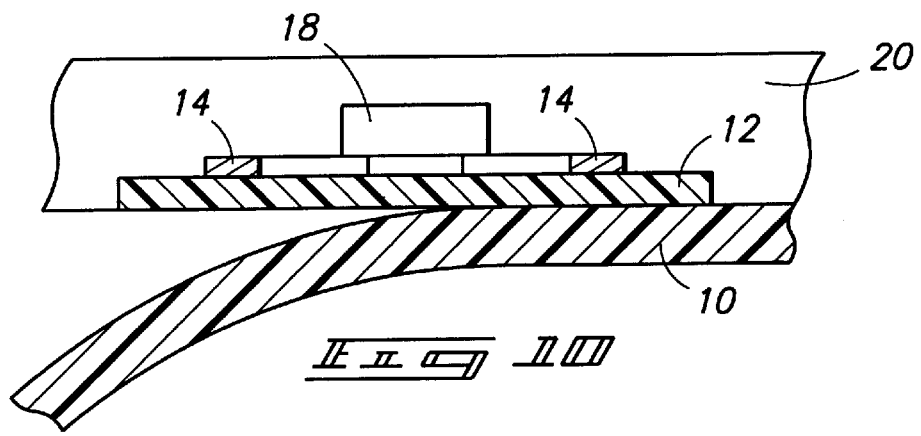
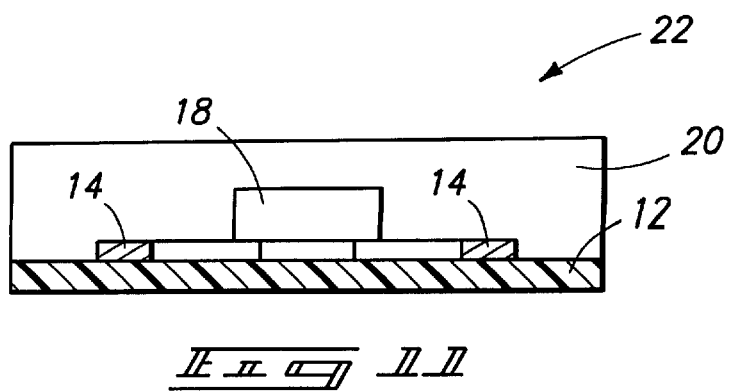

ELECTRONIC CIRCUITS AND CIRCUIT BOARDS

RELATED PATENT DATA

This patent resulted from a divisional application of U.S. application Ser. No. 08/585,428, filed on Jan. 11, 1996, entitled "Method of Forming a Circuit Board" listing the inventors as Rickie C. Lake, Joe Mousseau and Mark E. Tuttle.

TECHNICAL FIELD

This invention relates generally to methods of forming circuit boards, and to electronic circuit constructions.

BACKGROUND OF THE INVENTION

Integrated circuits and other components are typically surface mounted to printed wiring boards having conductive traces formed thereon. The electronic components might be mounted to one or both sides of such boards. Such components might constitute single discrete electronic components, such as capacitors and resistors, or constitute fabricated integrated circuit device packages.

Printed circuit boards have typically comprised thick, monolithic boards made of a ceramic or plastic materials. The materials of construction are highly electrically insulative, with the surfaces thereof being provided with printed circuit traces and landing areas to which the components mount. In certain applications, there is a continuing drive to produce thinner circuit board devices, such as might be received within a flexible credit card or radio frequency tag device. Such thin circuit board devices are typically encapsulated in an insulative, protecting encapsulating material, such as polyethylene. However, encapsulating materials such as polyethylene do not adhere very well to typical circuit board materials.

This invention concerns improved methods and materials of construction related to printed circuit board fabrication.

BRIEF DESCRIPTION OF THE DRAWINGS

Preferred embodiments of the invention are described below with reference to the following accompanying drawings.

FIG. 3 is a cross-sectional view of FIG. 2, taken along line 3—3 in FIG. 2.

FIG. 4 is a top view of the FIG. 1 substrate at a processing step subsequent to that shown by FIG. 2.

FIG. 5 is a cross-sectional view taken through line 5—5 in FIG. 4.

FIG. 9 is a cross-sectional view taken through line 9—9 in FIG. 8.

FIG. 10 is a view of the FIG. 9 fragment shown at a processing step subsequent to that depicted by FIG. 9.

FIG. 11 is a cross-sectional view of a circuit board component shown at a processing step subsequent to that depicted by FIG. 10.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a circuit board comprises:

providing a temporary substrate;

depositing an uncured electrically insulative circuit board material over the temporary substrate, the circuit board material adhering to the temporary substrate;

substantially curing the uncured circuit board material into at least one self supporting sheet;

providing circuit traces atop the cured self supporting sheet;

mounting an electronic circuit component atop the cured self supporting sheet in electrical communication with the circuit traces; and peeling the temporary substrate and cured self supporting sheet from one another.

In accordance with another aspect of the invention, a method of forming a circuit board comprises:

providing a temporary substrate;

a providing a series of discrete patterns of an uncured electrically insulative circuit board material over the temporary substrate, the discrete patterns forming desired outlines of a plurality of finished circuit boards, the circuit board material adhering to the temporary substrate;

substantially curing the uncured circuit board material into a plurality of self supporting circuit board sheets;

providing circuit traces atop the plurality of cured self supporting circuit board sheets;

mounting electronic circuit components atop the plurality of cured self supporting sheets in electrical communication with the circuit traces; and after providing the circuit traces and mounting the electronic circuit components, peeling the temporary substrate and plurality of cured self supporting sheets from one another.

In accordance with still a further aspect of the invention, an electronic circuit comprising:

a self-supporting electrically insulative ink or paint substrate, the ink or paint substrate having an outer surface;

circuit traces provided on the ink or paint substrate outer surface; and at least one electronic circuit component mounted to the ink or paint substrate outer surface in electrical connection with the circuit traces.

Figure 1:
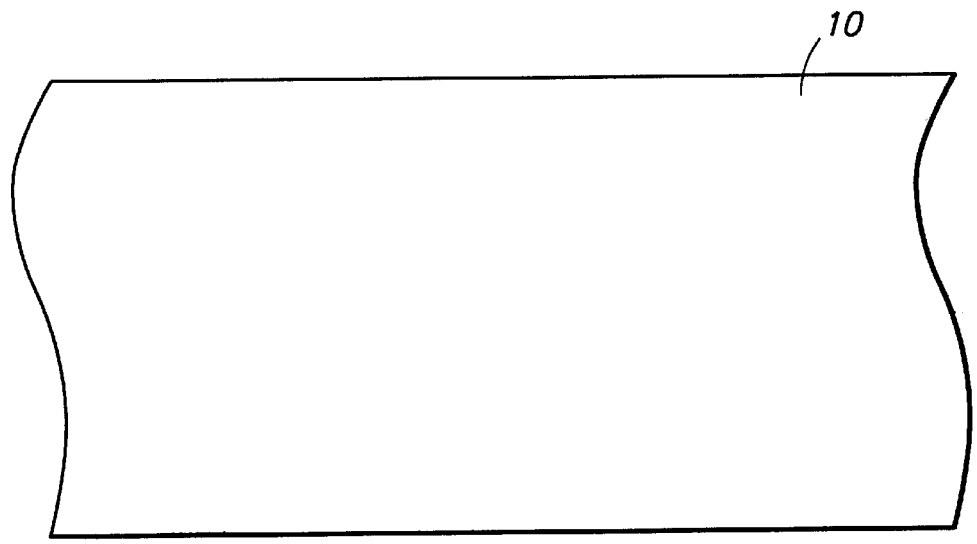
FIG. 1 is a top view of a substrate utilized in forming a circuit board in accordance with the invention.

More particularly and first with reference with FIG. 1, a thin temporary substrate or support film 10 is provided. Preferably, support film 10 constitutes a flexible material, although rigid materials such as glass, are also contemplated. Example and preferred other materials for substrate 10 include metal foils, metal plates, ceramics, wax or wax-coated substrates, polyester, Teflon®, plastics, and mixtures thereof.

Figure 2:
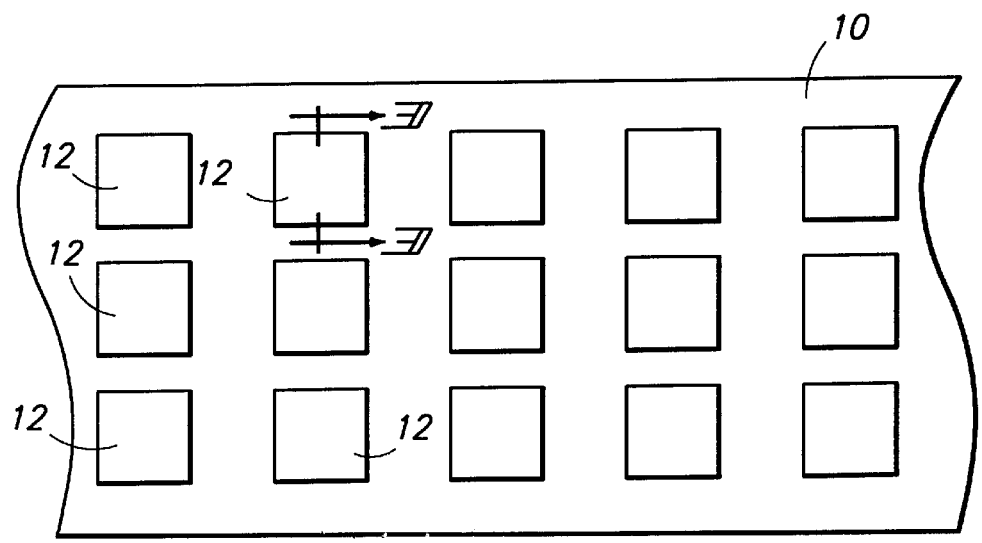
FIG. 2 is a view of the FIG. 1 substrate at a processing step subsequent to that shown by FIG. 1.

Referring to FIGS. 2 and 3, a series of discrete patterns 12 of an uncured electrically insulative circuit board material is provided over temporary substrate 10. Discrete patterns 12, as shown, form desired resultant outlines of a plurality of finished circuit boards. The most preferred circuit board material is ink provided to an example thickness of 0.5 mil to 4 mil. Example inks include PSP™ series inks available from NAZ-DAR Company of Kansas City, Mo. and Chicago, Ill. Such inks constitute acrylic, ultraviolet light curable inks typically heretofore only having been understood to be utilized in the graphic art industry, and never having been understood to be utilized as a self-supporting substrate utilized as a circuit board. Other example preferred circuit board materials in accordance with the invention include epoxies, polyester resins, polyurethanes, paint, varnish and mixtures thereof.

In accordance with the invention, such materials would be deposited or provided to substrate 10 in an initially uncured state, and yet adhere suitably to substrate 10. The method further comprises substantially curing the uncured circuit board material into a plurality of effective self-supporting capable circuit board sheets. Such curing will depend on the type of material utilized as the circuit board material of outlines 12. For example, ultraviolet light curable ink would be subjected to curing by exposing the FIGS. 2 and 3 construction to ultraviolet light. Other materials may require exposure to elevated temperatures for a certain period of time to effect desired curing. Further, other materials may inherently cure upon exposure to ambient air over a suitable period of time. The preferred manner by which discrete patterns 12 are provided is by a screen printing or stenciling technique. Alternate techniques could, of course, be utilized, but are believed to be less preferred.

Referring to FIGS. 4 and 5, desired circuit traces are provided atop the plurality of cured self-supporting circuit board sheets 12. Such are preferably provided by screen printing of a conductive material, such as EMCA-REMEX P2607 polymer silver available from Ablestick Laboratories of Montgomeryville, Pa.

Figure 6:
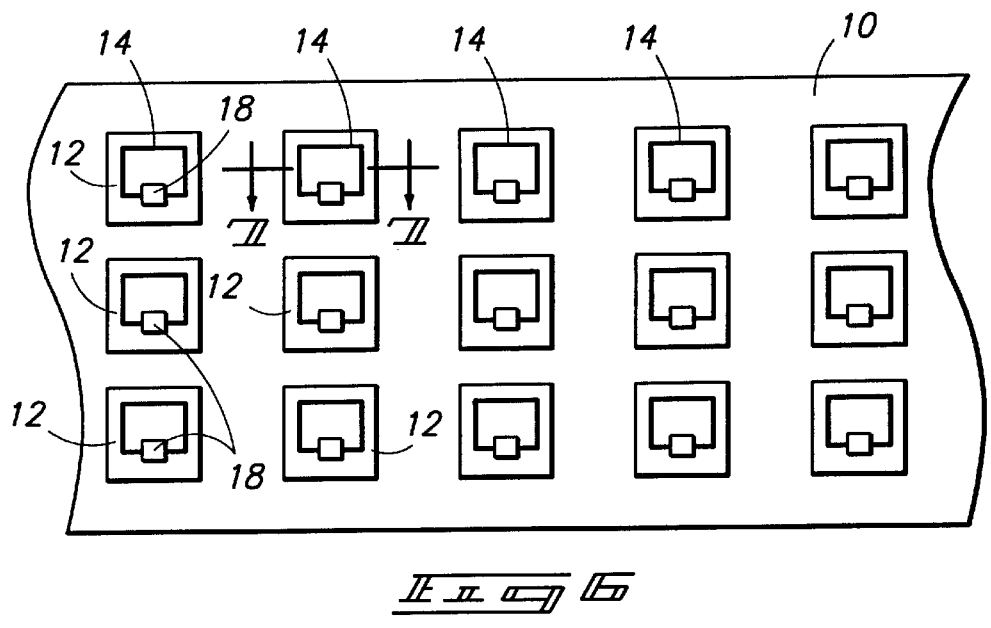
FIG. 6 is a top view of the FIG. 1 substrate at a processing step subsequent to that shown by FIG. 4.
Figure 7:
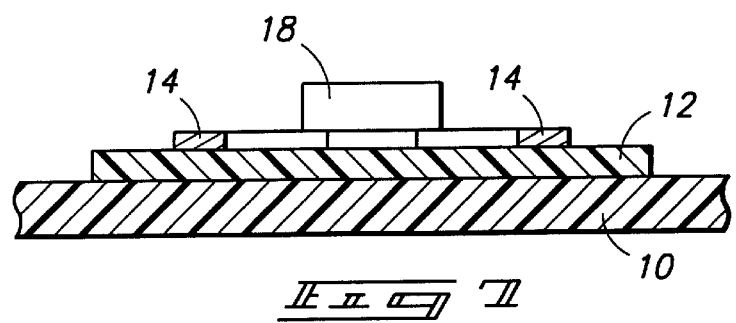
FIG. 7 is a cross-sectional view taken through line 7—7 in FIG. 6.

Referring to FIGS. 6 and 7, a series of electronic circuit components 18 are mounted atop the plurality of cured self-supporting sheets 12 in electrical communication with circuit traces 14, with at least one such component being shown mounted to each sheet 12. Such components might comprise any electronic component for the circuit, such as integrated circuit packages, capacitors, resistors, transistors, etc. Components 18 can be mounted with conductive epoxy, or by other means.

Figure 8:
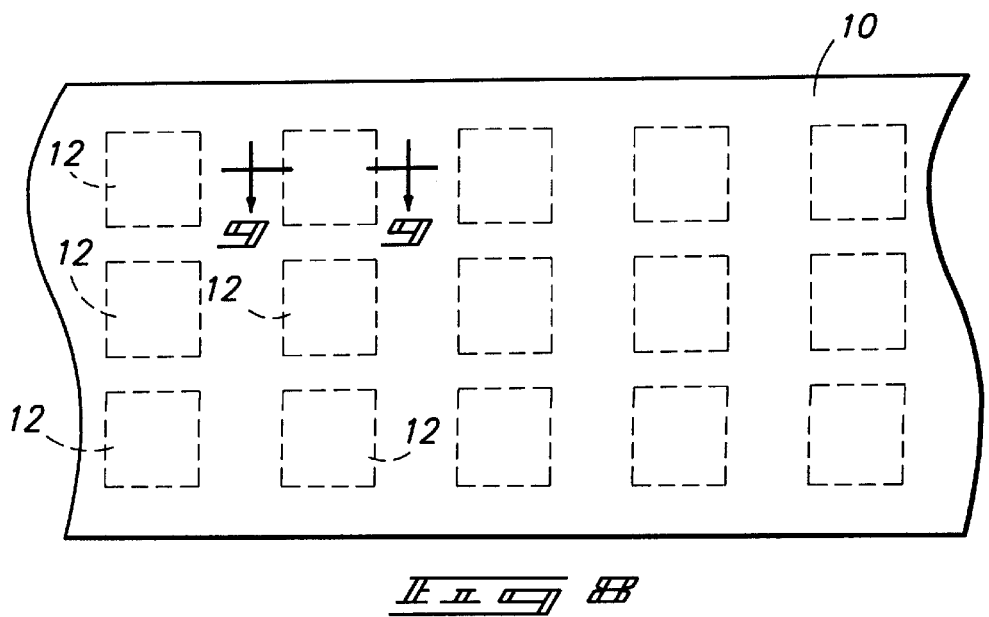
FIG. 8 is a top view of the FIG. 1 substrate shown at a processing step subsequent to that of FIG. 6.

Referring to FIGS. 8 and 9, an electrically insulative encapsulating layer 20 is provided over cured circuit board material 12 having circuit traces 14 and electronic circuit components 18 provided thereon. An example and preferred or typical encapsulation material is Epoxy Resin R1055 mixed with Hardener H5039 available from Epic Resin, Inc. of Palmyra, Wis.

Referring to FIG. 10, the encapsulation material is allowed to effectively cure, and then temporary substrate 10 and a singular composite of the collective plurality of circuit board sheets 12 within mass 20 are peeled away from one another.

Referring to FIG. 11, the resultant stripped composite sheet is cut by cutting through encapsulating layer 20 to form a plurality of discrete encapsulated circuit boards 22 having circuit traces 14 and at least one mounted electronic circuit component 18.

Preferably, the resultant discrete encapsulated circuit boards 22 are provided to be rigid, although a flexible construction is also contemplated thus with the cured circuit board material 12 also inherently preferably being flexible in such instance. Such will depend principally upon the material of composition of circuit boards 12, material 20 and their respective thicknesses. Further in the above-described embodiment, preferably the removed temporary substrate 10 is reused in fabricating additional circuit boards in accordance with the invention. Further, each of the temporary substrate, circuit board material and encapsulating layer can be flexible or rigid, with any of various combinations of the same. Also, the electronic circuit component are preferably mounted before peeling of the temporary substrate, but mounting after peeling is also contemplated.

Figure 12:
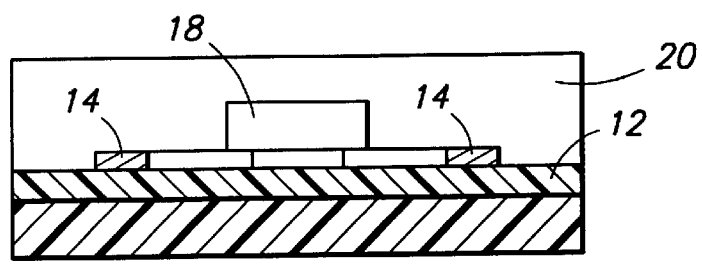
FIG. 12 is a view of an alternate embodiment circuit board assembly in an alternate method of forming a circuit board in accordance with the invention.
Figure 13:
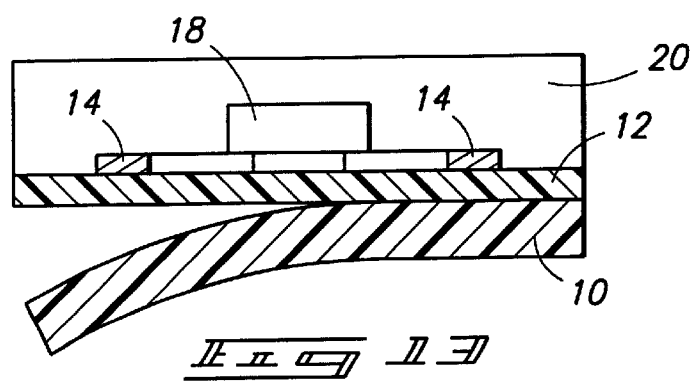
FIG. 13 is a view of the FIG. 12 construction at a processing step subsequent to that shown by FIG. 12.

Alternate methods and constructions are also contemplated, with the invention only being limited by the accompanying claims appropriately interpreted in accordance with the Doctrine of Equivalents. By way of example only, cutting of discrete encapsulated circuit boards might be conducted before the peeling step, with such cutting also extending through the temporary substrate. Subsequently, the respective temporary cut pieces of substrate would be peeled from the respective composite circuit boards. This is shown by FIGS. 12 and 13. However in such instance, the temporary substrates would not be practically reusable.

Alternately, the uncured printed circuit board material as-deposited might be blanket deposited over the entirety of surface of temporary substrate 10. Subsequent circuit trace patterning and electronic component mounting could occur as described above, with the subsequent cutting step cutting through the encapsulation material as well as the circuit board material to form the desired finished composite encapsulated circuit components.

Figure 14:
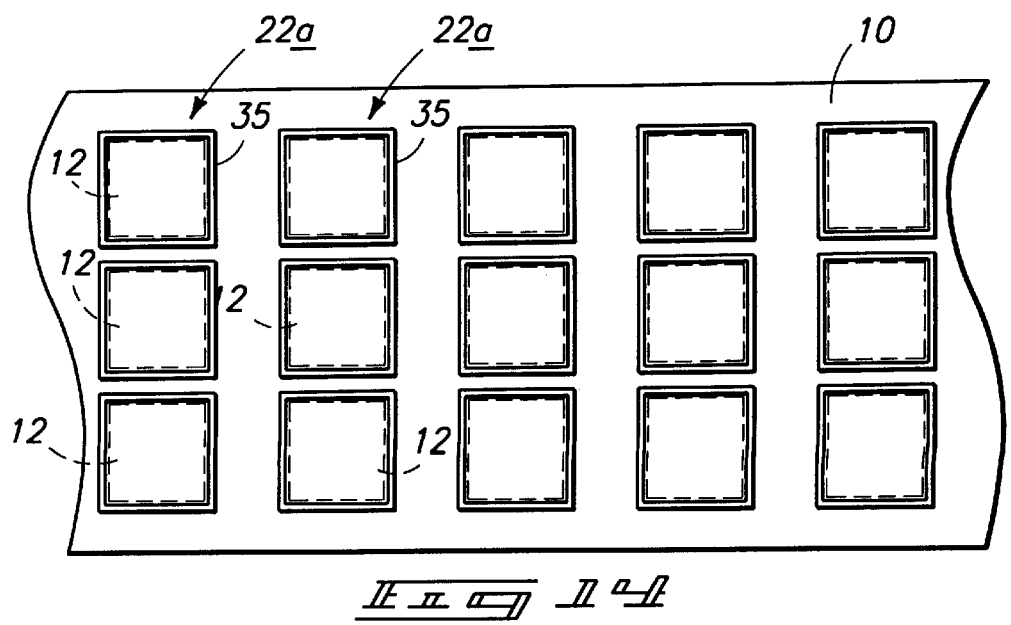
FIG. 14 is a top view of another alternately processed substrate and a method of forming a circuit board in accordance with the invention.

Yet another alternate example is described with reference to FIG. 14. Like numerals from the first described embodiment are utilized where appropriate, with differences being indicated by the suffix "a" or with different numerals. Here, a series of discrete dams 35 are provided around the respective cured circuit board sheets 12. Circuit board traces 14 and components 18 would be previously provided as in the first described embodiment. With dams 35 in place, electrically insulative encapsulating material would be provided within the confines of the dams over the cured circuit board sheets 12 to define a plurality of discrete encapsulated circuit board sheets 22a. Subsequently, temporary substrate 10 would be peeled away relative to discrete encapsulated circuit boards 22a. Alternately, a spatula could be used. The subject dam material could be removed either before or after the peeling step.

Further alternately by way of example only, provision of encapsulating material might be entirely eliminated in certain desired applications. Regardless, a desired outcome in accordance with the preferred embodiment is the resultant formation of an effective self-supporting flexible or rigid, electrically insulative ink or paint material substrate having circuit traces and at least one electronic component mounted to an outer surface thereof. Such substrate would subsequently typically be mounted to some other construction, such as another substrate, for example a credit card.

The above technology enables the user to employ an extremely thin permanent substrate for electronic circuitry which in turn minimizes overall assembly thickness. For example, UV curable inks can be easily applied at ½ mil thickness (0.0005 inch) onto an easily handled, low cost, 5 mil thick "releasable" polyester film.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. An electronic circuit comprising:
   a release layer;
   an electrically insulative ink substrate on the release layer and having an outer surface;
   circuit traces on the ink substrate outer surface; and
   at least one electronic circuit component mounted to the ink substrate outer surface in electrical connection with the circuit traces.

2. The electronic circuit of claim 1 further comprising an encapsulating material encapsulating the substrate outer surface, circuit traces and electronic component.

3. The electronic circuit of claim 1 wherein the release layer is a metal foil.

4. The electronic circuit of claim 1 wherein the release layer is polyester.

5. An electronic circuit comprising:
   a release layer;
   an electrically insulative paint substrate on the release layer and having an outer surface;
   circuit traces on the paint substrate outer surface; and
   at least one electronic circuit component mounted to the paint substrate outer surface in electrical connection with the circuit traces.

6. The electronic circuit of claim 5 further comprising an encapsulating material encapsulating the substrate outer surface, circuit traces and electronic component.

7. The electronic circuit of claim 5 wherein the release layer is a metal foil.

8. The electronic circuit of claim 5 wherein the release layer is polyester.

9. An electronic circuit comprising:
   a release layer;
   an electrically insulative ink substrate on the release layer and having an outer surface;
   circuit traces on the ink substrate outer surface; and
   at least one electronic circuit component mounted to the ink substrate outer surface with conductive epoxy.

10. The electronic circuit of claim 9 wherein the at least one electronic circuit component is in electrical connection with the circuit traces.

11. An electronic circuit comprising:
    a release layer;
    an electrically insulative ink substrate on the release layer and having an outer surface;
    circuit traces on the ink substrate outer surface; and
    at least one electronic circuit component mounted to the paint substrate outer surface with conductive epoxy.

12. The electronic circuit of claim 11 wherein the at least one electronic circuit component is in electrical connection with the circuit traces.

* * * * *

UNITED STATES PATENT AND TRADEMARK OFFICE
CERTIFICATE OF CORRECTION

PATENT NO.   : 6,166,915
DATED        : December 26, 2000
INVENTOR(S)  : Rickie C. Lake et al.

It is certified that error appears in the above-identified patent and that said Letters Patent is hereby corrected as shown below:

Title page,
Item [54], Title, replace "ELECTRONIC CIRCUITS AND CIRCUIT BOARDS" with -- CIRCUIT BOARD CONSTRUCTIONS --.

Column 6,
Line 25, replace "ink" with -- paint --.

Signed and Sealed this

Fifteenth Day of July, 2003

JAMES E. ROGAN
*Director of the United States Patent and Trademark Office*